(12) United States Patent
Kubo et al.

(10) Patent No.: US 8,391,045 B2
(45) Date of Patent: Mar. 5, 2013

(54) INFORMATION RECORDING/REPRODUCING DEVICE

(75) Inventors: Kohichi Kubo, Yokohama (JP);
Hirofumi Inoue, Kamakura (JP);
Mitsuru Sato, Kamakura (JP);
Chikayoshi Kamata, Kawasaki (JP);
Shinya Aoki, Yokohama (JP); Noriko Bota, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 447 days.

(21) Appl. No.: 12/563,739

(22) Filed: Sep. 21, 2009

(65) Prior Publication Data
US 2010/0238703 A1 Sep. 23, 2010

(30) Foreign Application Priority Data
Mar. 23, 2009 (JP) .................................. 2009-070835

(51) Int. Cl.
*G11C 11/00* (2006.01)
(52) U.S. Cl. .................... 365/148; 365/158; 365/171
(58) Field of Classification Search .................. 365/148, 365/158, 171, 163, 189.04, 189.14, 151, 365/145, 189.01
See application file for complete search history.

(56) References Cited

U.S. PATENT DOCUMENTS

| | | | | |
|---|---|---|---|---|
| 7,236,388 B2* | 6/2007 | Hosoi et al. | | 365/148 |
| 7,285,857 B2* | 10/2007 | Kwak et al. | | 257/745 |
| 7,767,568 B2* | 8/2010 | An et al. | | 438/588 |
| 2007/0133358 A1* | 6/2007 | Kubo et al. | | 369/13.38 |
| 2009/0040820 A1* | 2/2009 | Chao | | 365/163 |
| 2009/0225583 A1* | 9/2009 | Lee et al. | | 365/148 |
| 2009/0283739 A1* | 11/2009 | Kiyotoshi | | 257/4 |
| 2009/0296454 A1* | 12/2009 | Honda et al. | | 365/158 |
| 2009/0321709 A1* | 12/2009 | Muraoka et al. | | 257/4 |

FOREIGN PATENT DOCUMENTS

| | | |
|---|---|---|
| JP | 2006-80259 | 3/2006 |
| JP | 2008-503840 | 2/2008 |
| JP | 2008-84512 | 4/2008 |
| JP | 2008-234768 | 10/2008 |
| KR | 10-2007-0062937 | 6/2007 |
| KR | 10-2008-0052083 | 6/2008 |

OTHER PUBLICATIONS

Korean Office Action issued Jun. 8, 2011, in Patent Application No. 10-2010-0025197 (with English-language translation).
Tamihiro Gotoh, et al., "Minimal Phase-Change Marks Produced in Amorphous $Ge_2Sb_2Te_5$ Films", Japanese Journal of Applied Physics, vol. 43, No. 6B, 2004, pp. L818-L821.

(Continued)

*Primary Examiner* — Dang Nguyen
(74) *Attorney, Agent, or Firm* — Oblon, Spivak, McClelland, Maier & Neustadt, L.L.P.

(57) ABSTRACT

An information recording/reproducing device includes a first electrode layer, a second electrode layer, a recording layer as a variable resistance between the first and second electrode layer, and a circuit which supplies a voltage to the recording layer to change a resistance of the recording layer. Each of the first and second electrode layers is comprised of IV or III-V semiconductor doped with p-type carrier or n-type carrier.

19 Claims, 12 Drawing Sheets

OTHER PUBLICATIONS

A. Sawa, et al., "Hysteretic Current-Voltage Characteristics and Resistance Switching at a Rectifying $Ti/Pr_{0.7}Ca_{0.3}MnO_3$ Interface", Applied Physics Letters, vol. 85, No. 18, Nov. 1, 2004, pp. 4073-4075.

P. Vettiger, et al., "The "Millipede"—Nanotechnology Entering Data Storage", IEEE Transactions on Nanotechnology, vol. 1, No. 1, Mar. 2002, pp. 39-55.

P. Vettiger, et al., "Thousands of Microcantilevers for Highly Parallel and Ultra-Dense Data Storage", IEEE, IEDM03, 2003, pp. 763-766.

Atsushi Onoe, et al., "Nano-Sized Domain Inversion Characteristics in $LiNbO_3$ Group Single Crystals Using SNDM", Materials Science and Engineering B120, 2005, 130-133.

Japanese Office Action issued Jul. 26, 2011, in Patent Application No. 2009-070835 (with English-language translation).

\* cited by examiner

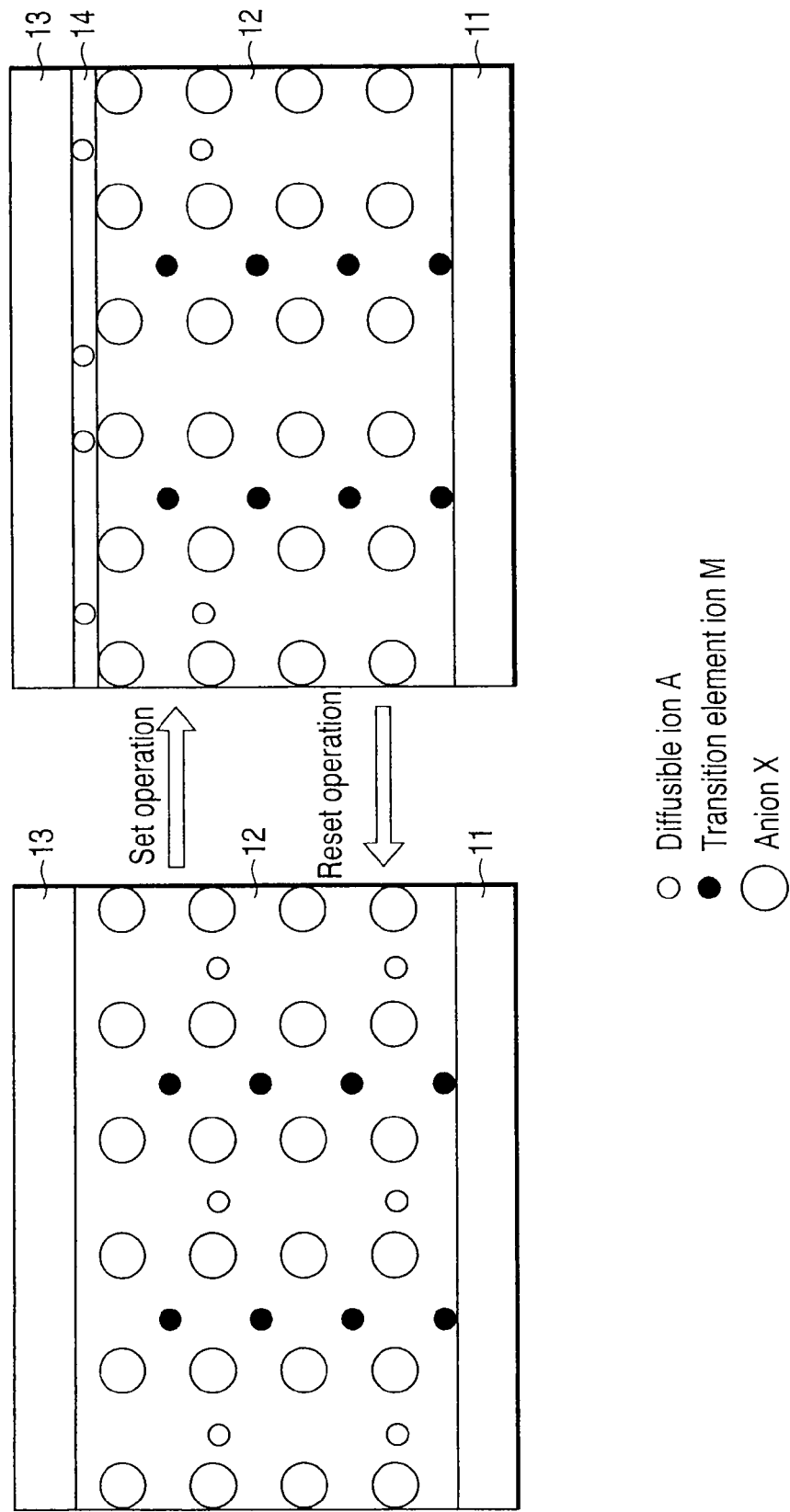
F I G. 1

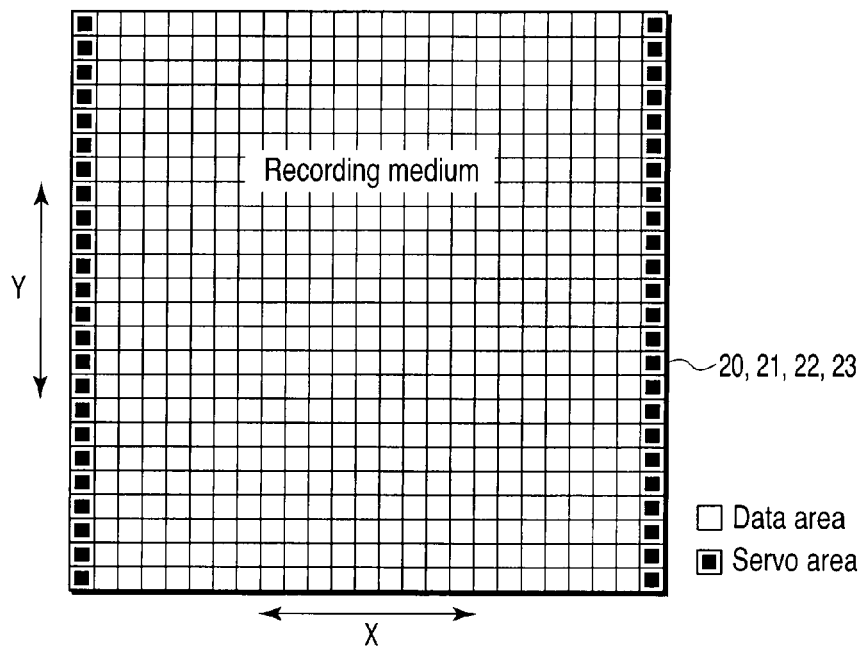
F I G. 3
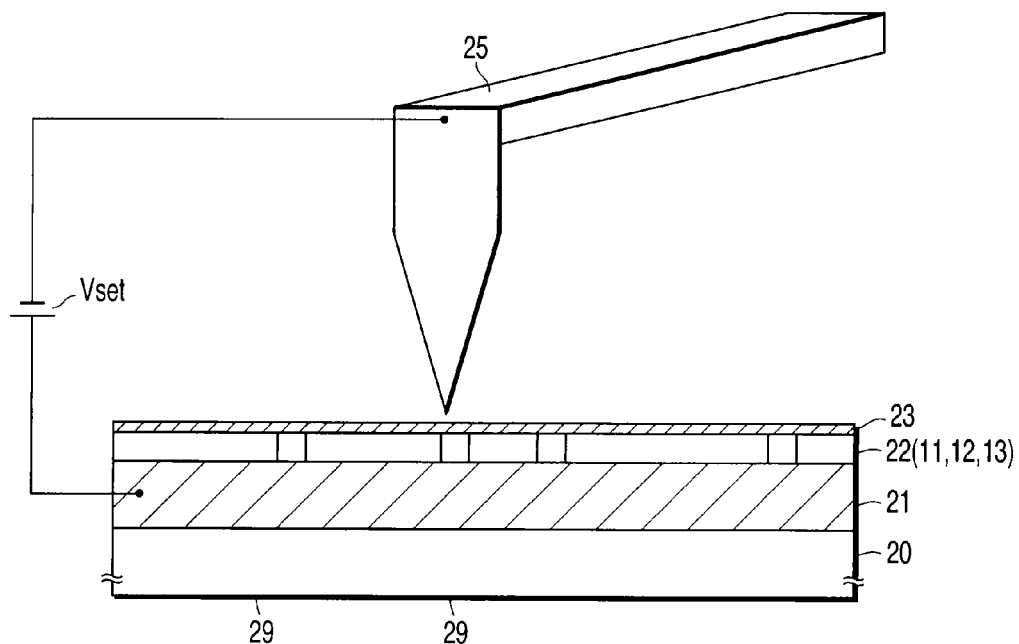
F I G. 4

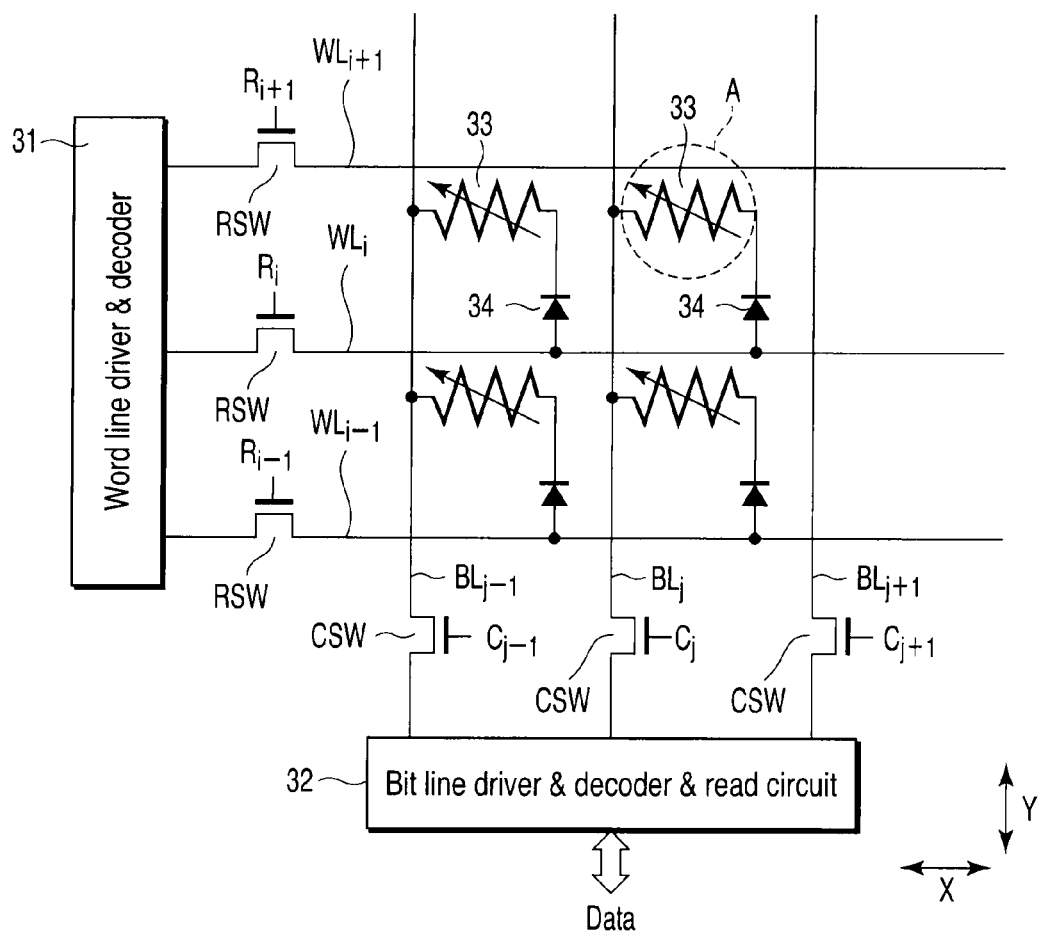
F I G. 8

INFORMATION RECORDING/REPRODUCING DEVICE

CROSS-REFERENCE TO RELATED APPLICATIONS

This application is based upon and claims the benefit of priority from prior Japanese Patent Application No. 2009-070835, filed Mar. 23, 2009, the entire contents of which are incorporated herein by reference.

BACKGROUND OF THE INVENTION

1. Field of the Invention

The present invention relates to an information recording/reproducing device with a high recording density.

2. Description of the Related Art

In recent years, compact portable devices have been widely used worldwide and, at the same time, a demand for a small-sized and large-capacity nonvolatile memory has been expanding rapidly along with the extensive progress of a high-speed information transmission network. Among them, particularly a NAND type flash memory and a small-sized HDD (hard disk drive) have rapidly evolved in recording density, and accordingly, they now form a large market.

Under such circumstances, some ideas for a new memory have been proposed, with the goal of greatly increasing the limit of recording density.

For instance, PRAM (phase change memory) adopts a principle in which materials capable of taking two conditions, an amorphous condition (ON) and crystalline condition (OFF), are used as recording materials, and these two conditions are caused to correspond to binary data "0" and "1" to record data.

Writing/erasing is performed in such a way that, for instance, the amorphous condition is prepared by applying a large power pulse to the recording material, and the crystalline condition is prepared by applying a small power pulse to the recording material. A reading is performed by causing a small read current to flow in the recording material to the degree that the writing/erasing is not generated, followed by measuring an electric resistance of the recording material. The resistance value of the recording material in the amorphous condition is larger than the resistance value of the recording material in the crystalline condition, and its ratio is in the degree of 103.

The greatest feature of the PRAM lies in a point that, even though element size is reduced to about 10 nm, the element can be operated. In this case, since the recording density of about 10 Tbpsi (tera bytes per square inch) can be realized, and accordingly, this is one of candidates for realizing increased recording density (for instance, refer to T. Gotoh, K. Sugawara and K. Tanaka, Jpn. J. Appl. Phys., 43, 6B, 2004, L818).

Further, a new memory has been reported which is different from the PRAM but has a very similar operation principle to the PRAM (for instance, refer to A. Sawa, T. Fuji, M. Kaisaki and Y. Tokura, Appl. Phys. Lett., 85, 18, 4073 (2004)).

According to this report, a representative example of a recording material to record data is nickel oxide, in which, like the PRAM, the large power pulse and the small power pulse are used for performing the writing/erasing. There has been reported an advantage that the power consumption at the time of the writing/erasing becomes small as compared with the PRAM.

Until now, although the details of an operation mechanism of the new memory are not clear, reproducibility is confirmed, and thus this is noticed as one of the candidates for the increased recording density. Further, some research groups are attempting to clarify the operation mechanism.

In addition thereto, proposed is a MEMS memory using MEMS (micro electro mechanical system) technology (for instance, refer to P. Vettiger, G. Cross, M. Despont, U. Drechsler, U. Durig, B. Gotsmann, W. Haberle, M. A. Lants, H. E. Rothuizen, R. Stutz and G. K. Binng, IEEE Trans. Nanotechnology 1, 39(2002)).

In particular, the MEMS memory, called Millipede, has a structure in which a plurality of array shaped cantilevers face a recording medium to which an organic substance is applied, and a probe at a tip of the cantilever comes into contact with the recording medium with appropriate pressure.

A writing is performed by selectively controlling the temperature of a heater added to the probe. That is, when increasing the temperature of the heater, the recording medium is softened, and then, depressions are formed on the recording medium because the probe forms dents in the recording medium.

A reading is performed by scanning the probe on a surface of the recording medium while causing a current to flow through the probe to the degree that the recording medium is not softened. When the probe sinks into the depression of the recording medium, temperature of the probe decreases, and the resistance value of the heater increases, so that it is possible to sense the data by reading this change of resistance value.

The greatest feature of the MEMS memory such as the Millipede lies in a point that since it is not necessary for each recording part to provide wiring to record bit data, the recording density can be improved remarkably. Under existing circumstances, a recording density of about 1 Tbps has already been achieved (for instance, refer to P. Vettiger, T. Albrecht, M. Despond, U. Drechsler, U. Durig, B. Gotsmann, D. Jubin, W. Haberle, M. A. Lants, H. E. Rothuizen, R. Stutz, D. Wiesmann and G. K. Binng, P. Bachtold, G. Cherubini, C. Hagleitner, T. Loeliger, A. Pantazi, H. Pozidis and E. Eleftheriou, in Technical Digest, IEDM03 pp. 763 to 766).

Further, subsequent to the Millipede, recently, performed are attempts to achieve a large improvement concerning power consumption, recording density or working speed while combining the MEMS technique with a new recording principle.

For instance, proposed is a system in which a ferroelectric layer is provided on the recording medium, and recording of the data is performed by causing dielectric polarization in the ferroelectric layer by applying a voltage to the recording medium. Theoretically, this system is predicted to be able to utilize one crystal as a unit (recording minimum unit) for recording one byte of data.

If the recording minimum unit is equivalent to one unit cell of the crystal of the ferroelectric layer, the recording density rises to a phenomenal approx. 4 Pbpsi (peta bytes per square inch).

Recently, based on development of a read system using SNDM (scanning nonlinear dielectric microscope), the new memory has advanced considerably toward practical use (for instance, refer to A. Onoue, S. Hashimoto, Y. Chu, Mat. Sci. Eng. B120, 130(2005)).

BRIEF SUMMARY OF THE INVENTION

An information recording/reproducing device according to an aspect of the present invention comprises a first electrode layer, a second electrode layer, a recording layer as a variable resistance between the first and second electrode layer, and a circuit which supplies a voltage to the recording layer to change a resistance of the recording layer. Each of the first and second electrode layers is comprised of IV or III-V semiconductor doped with p-type carrier or n-type carrier.

BRIEF DESCRIPTION OF THE SEVERAL VIEWS OF THE DRAWING

FIG. 1 is a diagram showing a structure of a recording layer.
FIG. 3 is a diagram showing a recording medium.
FIG. 4 is a diagram showing a recording mode.
FIG. 8 is a diagram showing a semiconductor memory.

DETAILED DESCRIPTION OF THE INVENTION

Figure 2:
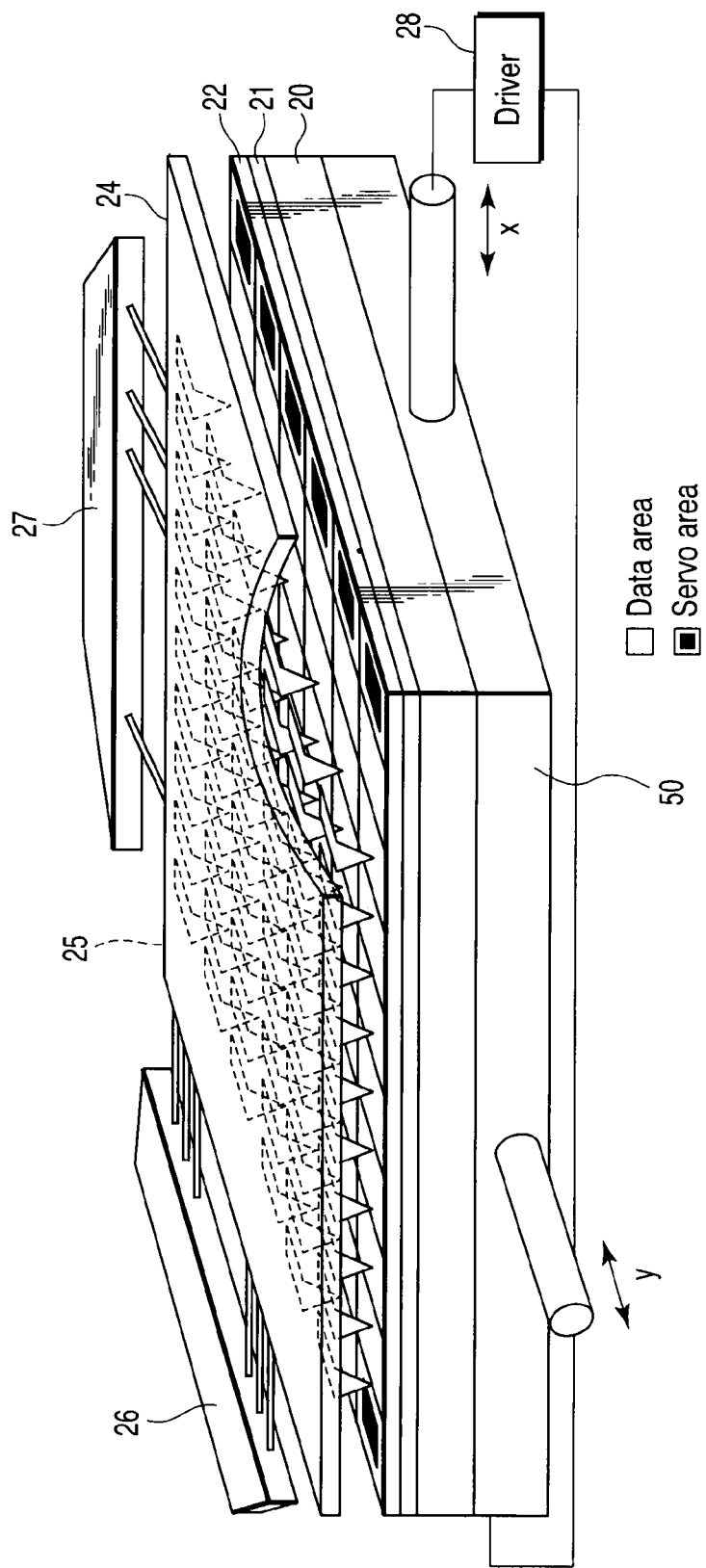
FIG. 2 is a diagram showing a probe memory.

An information recording/reproducing device of an aspect of the present invention will be described below in detail with reference to the accompanying drawing.

1. Outline

A data recording/reproducing device according to an example of the present invention is characterized in that a resistance-change material that changes its resistance when a voltage is applied or a current is supplied is used as a recording layer, and that p- or n-type-carrier-doped IV or III-V semiconductor layers (electrode layers) are formed in contact with the upper and lower surfaces of the recording layer.

This semiconductor layer prevents deterioration of the characteristics caused by the repetition of set/reset operations (write/erase operations), i.e., prevents the compound (resistance-change material) forming the recording layer from losing reversibility and having irreversibility.

Note that the data recording/reproducing device according to the example of the present invention records data by the resistance change of the recording layer, so the resistivity of the semiconductor is desirably smaller than the minimum resistivity of the recording layer. For example, the carrier density of the semiconductor is set at $1 \times 10^{18}$ atoms/cc or more, or the resistivity of the semiconductor is set at $10^{-1}$ Ωcm or less.

The principle of preventing degradation of the characteristics of the recording layer is as follows.

Although the initial recording layer is an insulator, some cation elements existing inside the recording layer move toward the negative electrode when a potential difference is produced across the two ends of the recording layer. Consequently, when a first compound is positioned on the positive electrode side and a second compound is positioned on the negative electrode side, cation elements released from the first compound are inserted into the second compound, so the ratio of cations becomes relatively higher than that of anions in the second compound. At the same time, the second compound receives electrons from the negative electrode in order to maintain electrical neutrality, so the valence of the transition element in the second compound decreases, and the second compound becomes a low-oxidation compound.

Also, the ratio of cations becomes relatively lower than that of anions in the first compound positioned on the positive electrode side. Accordingly, the first compound becomes a high-oxidation compound by releasing electrons toward the positive electrode.

This is a set operation.

When a current is supplied to the recording layer (low-resistance material) in this set state again, a large current flows because of a low resistance even if the potential difference is small. The large current produces Joule heat, and raises the temperature of the recording layer.

This thermal energy returns a high-energy metastable state raised by the set operation described above to the state of an insulator as a low-energy stable state before the set operation.

This is a reset operation.

When a voltage is applied across the two ends of the recording layer, however, the oxidizing power (power that draws oxygen from the compound) acts on the positive electrode side, and the reducing power (power that draws oxygen toward the compound) acts on the negative electrode side. Simultaneously, Joule heating by a current accelerates the reaction between the recording layer and the electrode, so the compound forming the recording layer may cause irreversible deterioration.

The present invention has the structure in which the electrode layer consisting of the doped IV or III-V semiconductor is in direct contact with the recording layer described above. This electrode layer suppresses the above-mentioned irreversible reaction, and largely increases the breakdown voltage and thermal resistance of the data recording/reproducing device.

2. Basic Principle of Recording/Reproducing

The basic principle of data recording/reproducing performed by the data recording/reproducing device according to the example of the present invention will be explained below.

FIG. 1 shows the structure of a recording portion.

Reference numeral 11 denotes an electrode layer; 12, a recording layer; and 13, an electrode layer. In the recording layer 12, small hollow circles represent diffusible ions A, small solid circles represent transition element ions M, and large hollow circles represent anions X.

When a potential gradient is produced in the recording layer 12 by applying a voltage to it, some diffusible ions move in the crystal. In the example of the present invention, therefore, the initial state of the recording layer 12 is an insulator (high-resistance state), and data is recorded by changing the phase of the recording layer 12 by the potential gradient, and giving the recording layer 12 conductivity (setting the recording layer 12 in a low-resistance state).

In this specification, the high-resistance state is defined as a reset state, and the low-resistance state is defined as a set state. However, the purpose of the definitions is to simplify the explanation, so the definitions may be switched, i.e., the low-resistance state may be defined as the reset (initial) state, and the high-resistance state may be defined as the set state, depending on the selection of materials or the manufacturing method. That is, the scope of the present invention naturally includes a case like this.

First, a state in which, for example, the potential of the electrode layer 13 is relatively lower than that of the electrode layer 11 is formed. Assuming that the electrode layer 11 has a fixed potential (e.g., ground potential), a negative potential need only be given to the electrode layer 13.

In this state, some diffusible ions in the recording layer 12 move toward the electrode layer (cathode) 13, so the diffusible ions in the recording layer (crystal) 12 reduce relative to the anions. The diffusible ions having moved toward the electrode layer 13 receive electrons from the electrode layer 13 and deposit as a metal, thereby forming a metal layer 14.

The anions become excessive in the recording layer 12, and as a consequence raise the valence of the transition element ions in the recording layer 12. That is, since carrier injection gives electron conductivity to the recording layer 12, data recording (set operation) is completed.

Data can easily be reproduced by supplying a current pulse to the recording layer 12 and detecting the resistance of the recording layer 12. Note that the current pulse must have a very small by which the material forming the recording layer 12 does not change its phase.

The process described above is a kind of electrolysis; it is possible to regard the process as a phenomenon in which electrochemical oxidation produces an oxidizing agent on the side of the electrode layer (anode) 11, and electrochemical reduction produces a reducing agent on the side of the electrode layer (cathode) 13.

To return the data recording state (low-resistance state) to the initial state (high-resistance state), for example, the recording layer 12 need only be heated by Joule heat by using a large-current pulse, thereby accelerating the redox reaction in the recording layer 12. That is, the residual heat after the large-current pulse is shut down returns the recording layer 12 to the insulator (reset operation).

To put this operation principle to practical use, however, it is necessary to prevent the reset operation at room temperature (secure a sufficiently long retention time), and well reduce the power consumption of the reset operation.

The former condition can be achieved by decreasing the coordination number of the diffusible ions (to, ideally, two or less), increasing the valence of the diffusible ions to two or more, or increasing the valence of the anions (to, ideally, three or more).

The latter condition can be achieved by decreasing the valence of the diffusible ions to two or less so as not to cause any crystal rupture, and finding a material having many movement paths of the diffusible ions moving in the recording layer (crystal) 12.

After the set operation, an oxidizing agent is produced on the side of the electrode layer (anode) 11. However, deterioration caused by this oxidizing agent is alleviated because the electrode layer 11 consists of the p- or n-type-carrier-doped IV or III-V semiconductor.

In addition, the electrode layer 11 preferably consists of a material having no ion conductivity.

Also, after the set operation, a reducing agent is produced on the side of the electrode layer (cathode) 13. However, deterioration caused by this reducing agent is alleviated because the electrode layer 13 consists of the p- or n-type-carrier-doped IV or III-V semiconductor.

In addition, the electrode layer 13 preferably has a function of preventing the recording layer 12 from reacting with the atmosphere.

Examples of a material meeting the above conditions at the same time are diamond, diamond-like carbon (DLC), and a material obtained by injecting p- or n-type carriers into a IV or III-V semiconductor such as Si, SiC, SiGe, Ge, or GaN.

The present invention is applicable to both a monopolar operation and bipolar operation.

The monopolar operation is an operation in which the set/reset operation, e.g., the resistance of the recording layer is changed by voltages having an identical voltage polarity. The bipolar operation is an operation in which the set/reset operation, i.e., the resistance of the recording layer is changed by voltages having different voltage polarities.

3. Embodiments

Several embodiments regarded as best will now be explained.

In the following description, examples of the present invention will be explained for two cases in which the present invention is applied to a probe memory and semiconductor memory.

(1) Probe Memory

A. Structure

FIGS. 2 and 3 illustrate a probe memory according to the example of the present invention.

A recording medium is placed on an X-Y scanner 50. A probe array is set to face this recording medium.

The probe array has a semiconductor substrate 24, and probes (heads) 25 arranged in the form of an array on one surface of the semiconductor substrate 24. Each probe 25 is, e.g., a cantilever, and driven by multiplex drivers 26 and 27.

The probes 25 can individually be operated by using microactuators in the semiconductor substrate 24. However, an example in which the data area of the recording medium is accessed by making all the probes 25 perform the same operation will be explained below.

First, the multiplex drivers 26 and 27 are used to make all the probes 25 go back and forth at a predetermined period in the X-direction, thereby reading Y-direction positional information from the servo area of the recording medium. The Y-direction positional information is transferred to a driver 28.

Based on this positional information, the driver 28 drives the X-Y scanner 50 to move the recording medium in the Y-direction, thereby positioning the recording medium and probes.

When the recording medium and probes are completely positioned, data reading or writing is continuously performed on all the probes 25 on the data area at the same time.

Data reading and writing are continuously performed because the probes 25 go back and forth in the X-direction. Also, data reading and writing are performed line by line on the data area by sequentially changing the position in the Y-direction of the recording medium.

Note that it is also possible to read the positional information from the recording medium by making it go back and forth at a predetermined period in the X-direction, and move the probes 25 in the Y-direction.

The recording medium includes, e.g., a semiconductor substrate 20, an electrode layer 21 on the semiconductor substrate 20, and a recording material layer 22 on the electrode layer 21.

Unlike the electrode layers 11 and 13 shown in FIG. 1, the electrode layer 21 consists of a metal.

The recording material layer 22 includes the electrode layer 11, recording layer 12, and electrode layer 13 shown in FIG. 1.

The recording material layer 22 has data areas, and servo areas arranged at the two ends of the data areas in the X-direction. The data areas occupy the main part of the recording material layer 22.

A servo burst signal is recorded in the servo area. The servo burst signal indicates Y-direction positional information in the data area.

In addition to these pieces of information, an address area for recording addresses and a preamble area for synchronization are arranged in the recording material layer 22.

Data and the servo burst signal are recorded as recording bits (resistance fluctuations) in the recording material layer 22. Binary "1" or "0" of the recording bit is read by detecting the resistance of the recording material layer 22.

In this example, one probe (head) is prepared for one data area, and another probe is prepared for one servo area.

The data area has tracks. A track in the data area is specified by an address signal read from the address area. The servo burst signal read from the servo area is used to move the probe 25 to the track center, thereby eliminating a read error of a recording bit.

The head position control technique of an HDD can be used by making the X- and Y-directions respectively correspond to a down track direction and track direction.

B. Recording/Erasing/Reproducing

Recording/erasing/reproducing of the probe memory shown in FIGS. 2 and 3 will be explained below.

Figure 5:
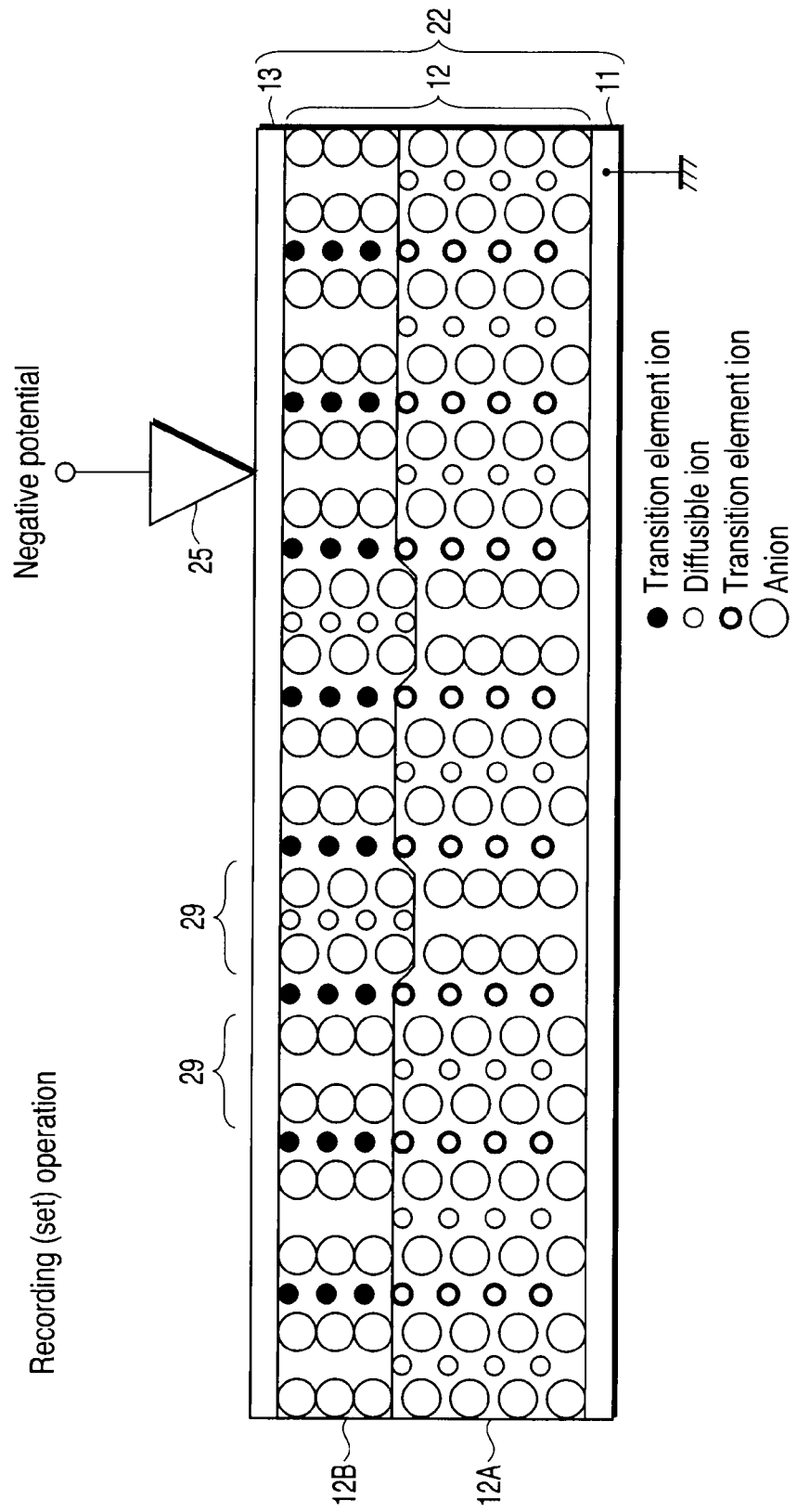
FIG. 5 is a diagram showing a write operation.

FIGS. 4 and 5 illustrate the state of recording/erasing.

The recording medium includes the electrode layer 21 on the semiconductor substrate (e.g., silicon chip) 20, the recording material layer 22 on the electrode layer 21, and a protection layer 23 on the recording material layer 22. The protection layer 23 consists of, e.g., a thin insulator.

The recording operation is performed by producing a potential gradient inside a recording bit 29 of the recording material layer 22 by applying a voltage to the recording bit 29. More specifically, a current/voltage pulse need only be given to the recording bit 29.

In this example, a state in which the potential of the probe 25 is relatively higher than that of the electrode layer 21 is formed. A positive potential need only be given to the probe 25, when the electrode layer 21 has a fixed potential (e.g., ground potential).

In this state, some cation elements (diffusible ions) in a first compound (anode side) 12A of the recording material layer 22 move in the crystal, and enter an air gap site of a second compound (cathode side) 12B.

Accordingly, the valence of cations (transition element ions) in the first compound 12A increases, and that of cations (transition element ions) in the second compound 12B decreases.

Consequently, the recording bit 29 of the recording material layer 22 changes from the high-resistance state to the low-resistance state, and the set operation (recording) is completed.

In the erase operation, a state in which the potential of the probe 25 is relatively lower than that of the electrode layer 21 is formed. A negative potential need only be given to the probe 25, when the electrode layer 21 has a fixed potential (e.g., ground potential).

In this state, some cation elements (diffusible ions) in the second compound (anode side) 12B of the recording material layer 22 move in the crystal, and enter an air gap site of the first compound (cathode side) 12A.

Accordingly, the valence of the cations (transition element ions) in the second compound 12B increases, and that of the cations (transition element ions) in the first compound 12A decreases.

Consequently, the recording bit 29 of the recording material layer 22 changes from the low-resistance state to the high-resistance state, and the reset operation (erasing) is completed.

Note that when the positions of the first and second compounds 12A and 12B are switched in the recording/erasing operations, the set operation can be executed by making the potential of the probe 25 relatively lower than that of the electrode layer 21.

Figure 6:
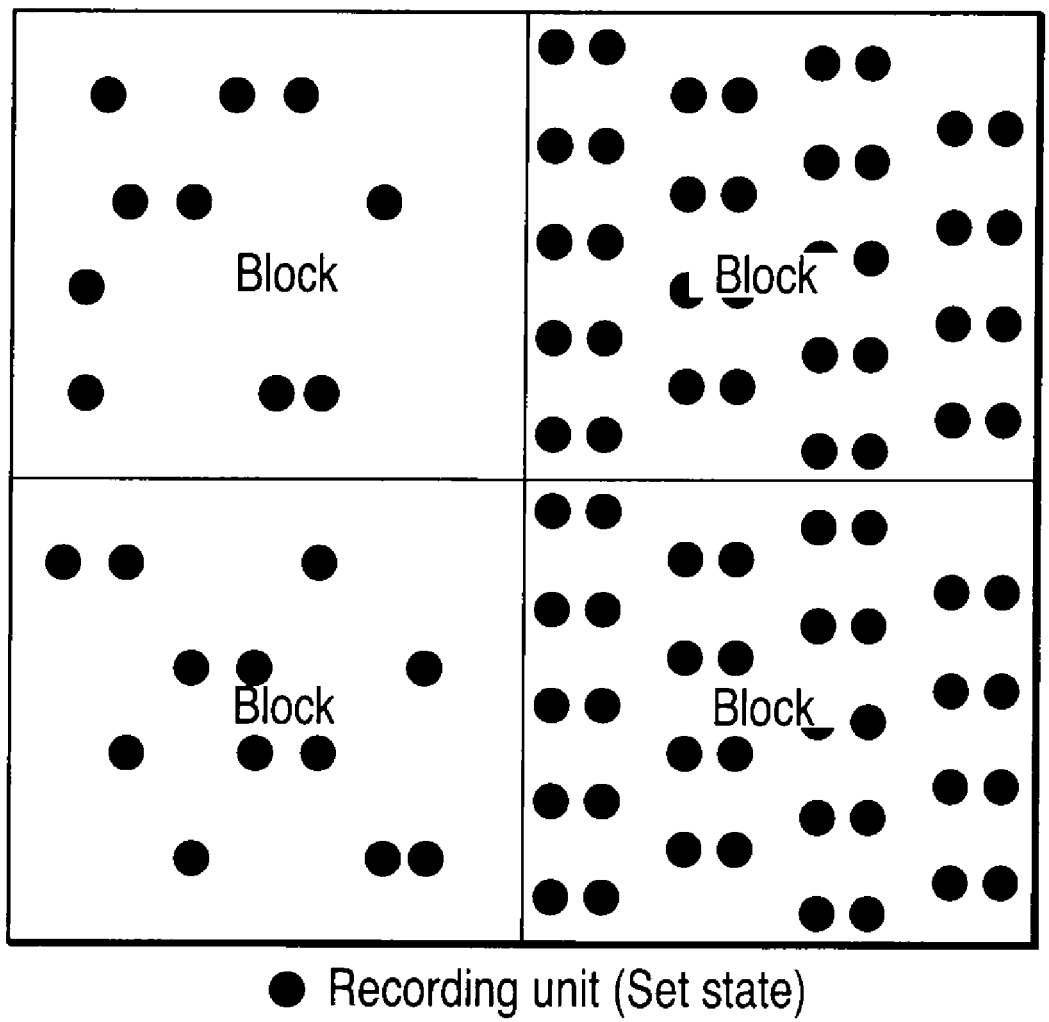
FIG. 6 is a diagram showing a recording unit in a block.

FIG. 6 shows blocks in the data area after data recording is completed.

Solid circles represent recording units in which data is recorded. The probe memory of this example can record data in each recording unit of the recording medium in the same manner as in a hard disk, and can also achieve a recording density higher than those of the conventional hard disks and semiconductor memories because the novel recording material is used.

Figure 7:
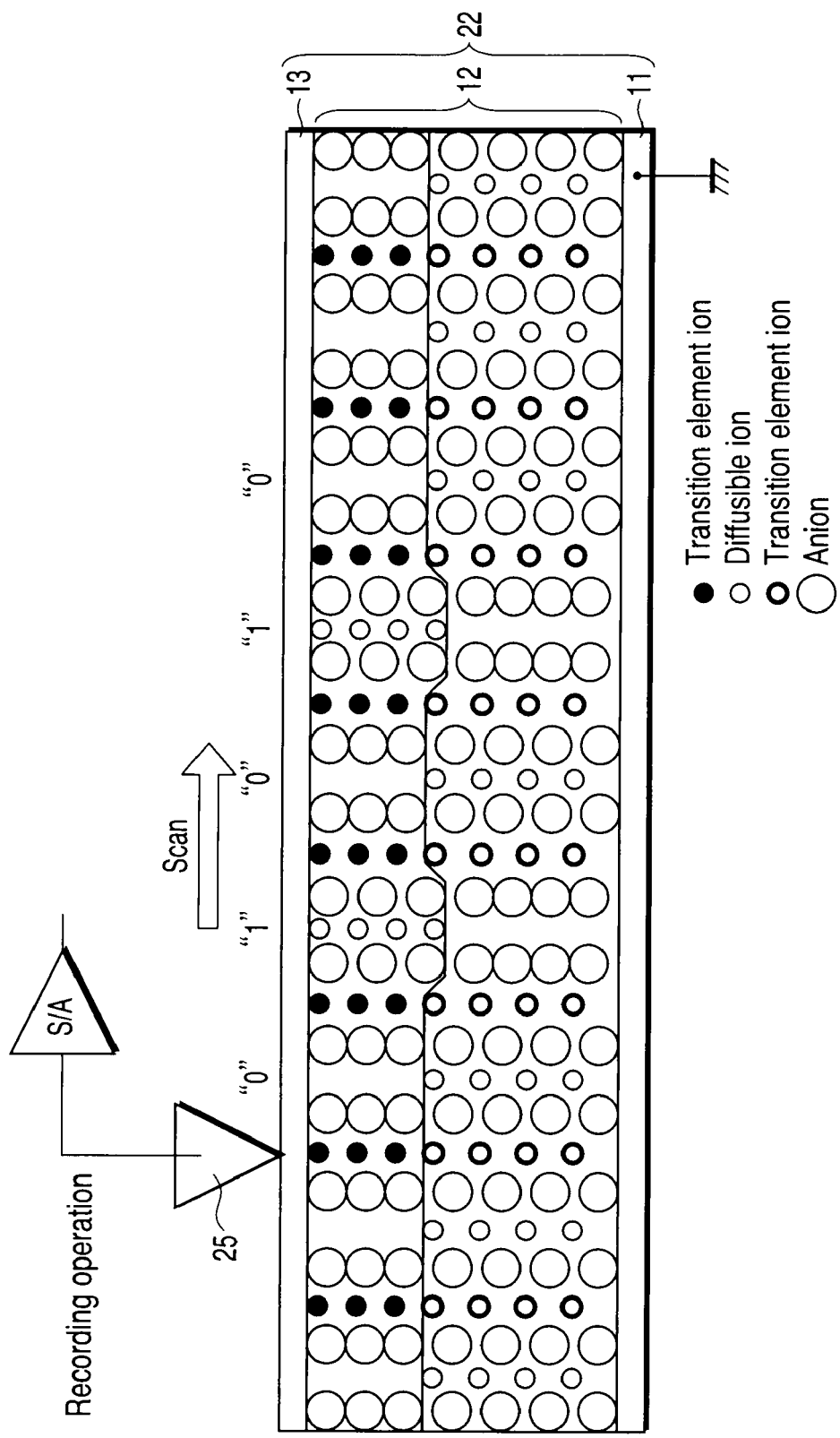
FIG. 7 is a diagram showing a read operation.

FIG. 7 shows the state of reproducing.

The reproducing operation is performed by supplying a current pulse to the recording bit 29, and detecting the resistance of the recording bit 29. A current pulse has a very small by which the recording material forming the recording bit 29 does not change the resistance.

For example, a read current (current pulse) produced by a sense amplifier S/A is supplied from the probe 25 to the recording material layer (recording bit) 22, and the sense amplifier S/A measures the resistance of the recording bit.

The use of this structure makes it possible to secure a resistance difference of $10^3$ or more between the set and reset states.

Note that the reproducing operation can continuously be performed by scanning the probe 25.

C. Summary

The probe memory as described above can achieve a higher recording density and lower power consumption than those of the existing hard disks and flash memories.

(2) Semiconductor Memory

A. Structure

FIG. 8 shows a cross-point semiconductor memory according to the example of the present invention.

Word lines WLi−1, WLi, and WLi+1 run in the X-direction, and bit lines BLj−1, BLj, and BLj+1 run in the Y-direction.

One end of each of the word lines WLi−1, WLi, and WLi+1 is connected to a word line driver & decoder 31 via a MOS transistor RSW as a select switch. One end of each of the bit lines BLj−1, BLj, and BLj+1 is connected to a bit line driver & decoder & read circuit 32 via a MOS transistor CSW as a select switch.

Select signals Ri−1, Ri, and Ri+1 for selecting one word line (row) are input to the gate of the MOS transistor RSW. Select signals Cj−1, Cj, and Cj+1 for selecting one bit line (column) are input to the gate of the MOS transistor CSW.

Memory cells 33 are arranged at the intersections of the word lines WLi−1, WLi, and WLi+1 and bit lines BLj−1, BLj, and BLj+1. This structure is a so-called, cross-point cell array structure.

A diode 34 for preventing a sneak current during recording/reproducing is added to the memory cell 33.

Figure 9:
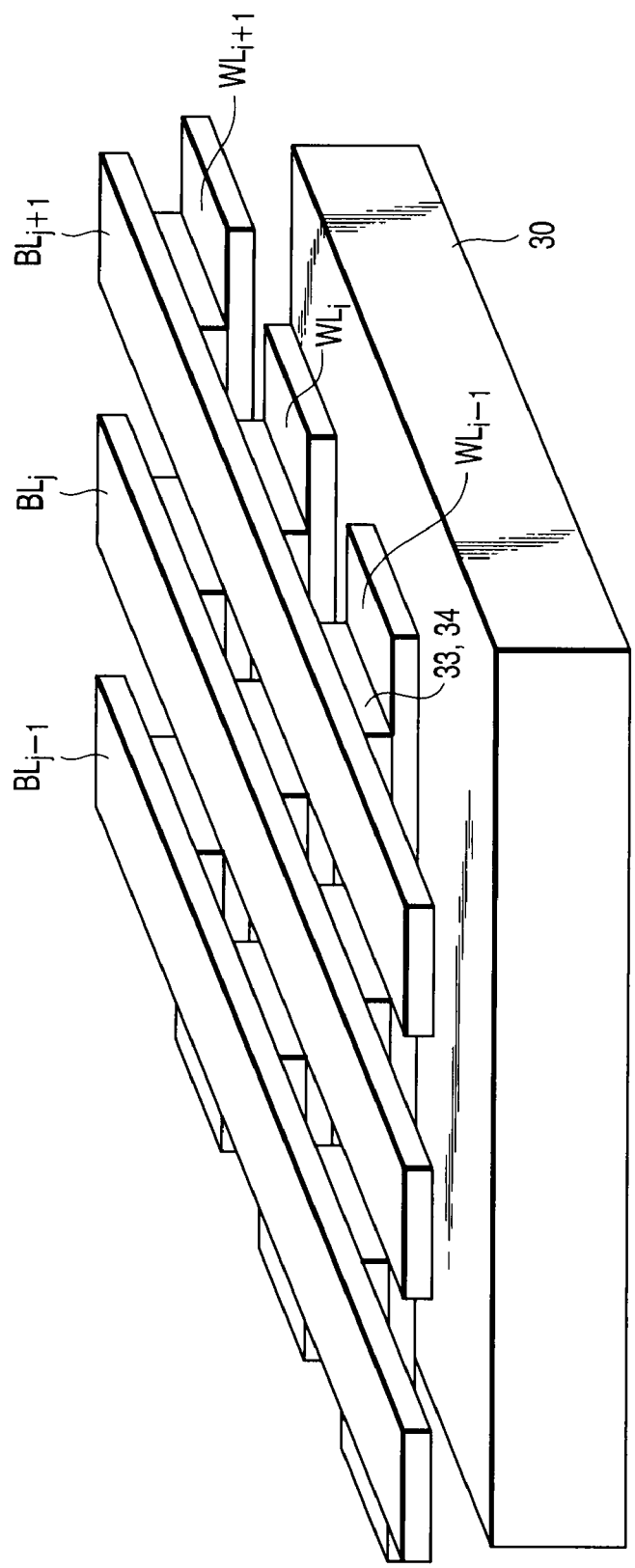
FIG. 9 is a diagram showing a memory cell array.

FIG. 9 shows the structure of the memory cell array portion of the semiconductor memory shown in FIG. 8.

On a semiconductor chip 30, the word lines WLi−1, WLi, and WLi+1 and bit lines BLj−1, BLj, and BLj+1 are arranged, and the memory cells 33 and diodes 34 are arranged at the intersections of these lines.

Figure 11:
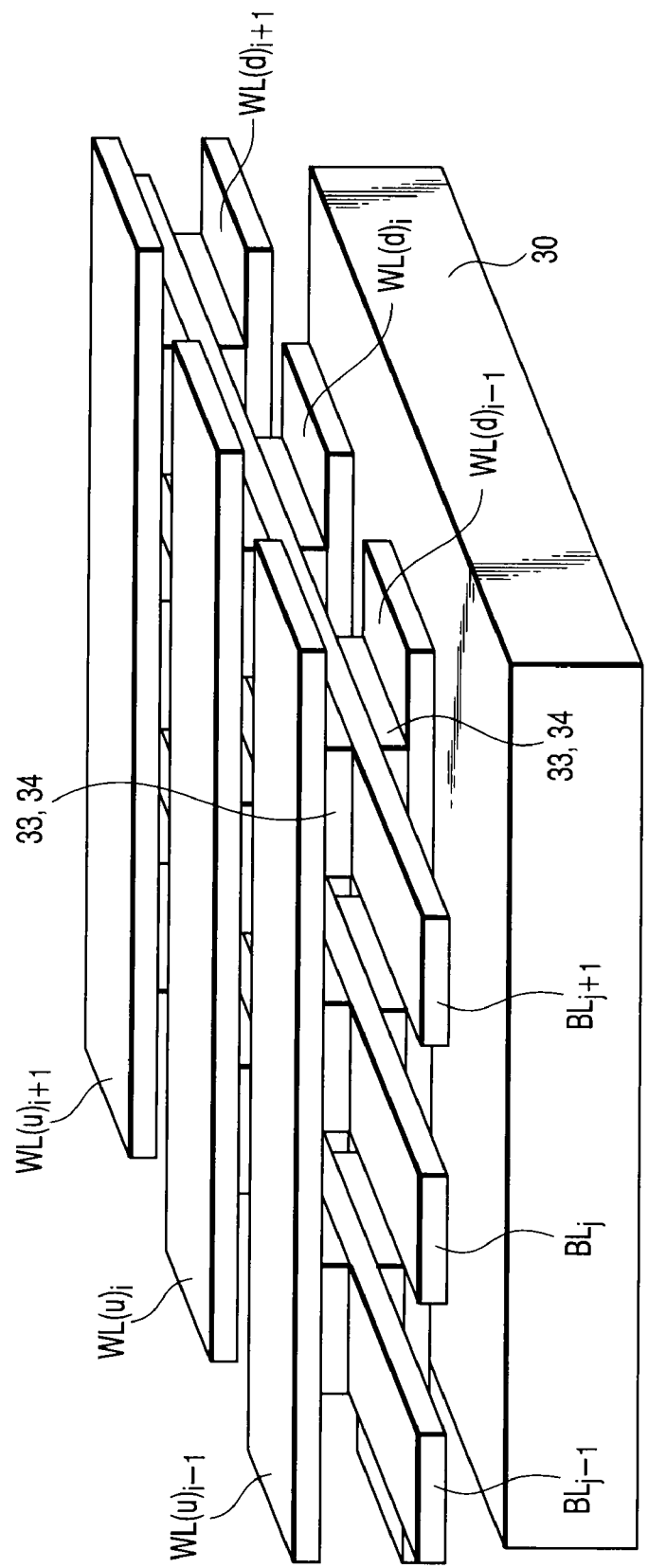
FIGS. 11 and 12 are diagrams, each showing a memory cell array.
Figure 12:
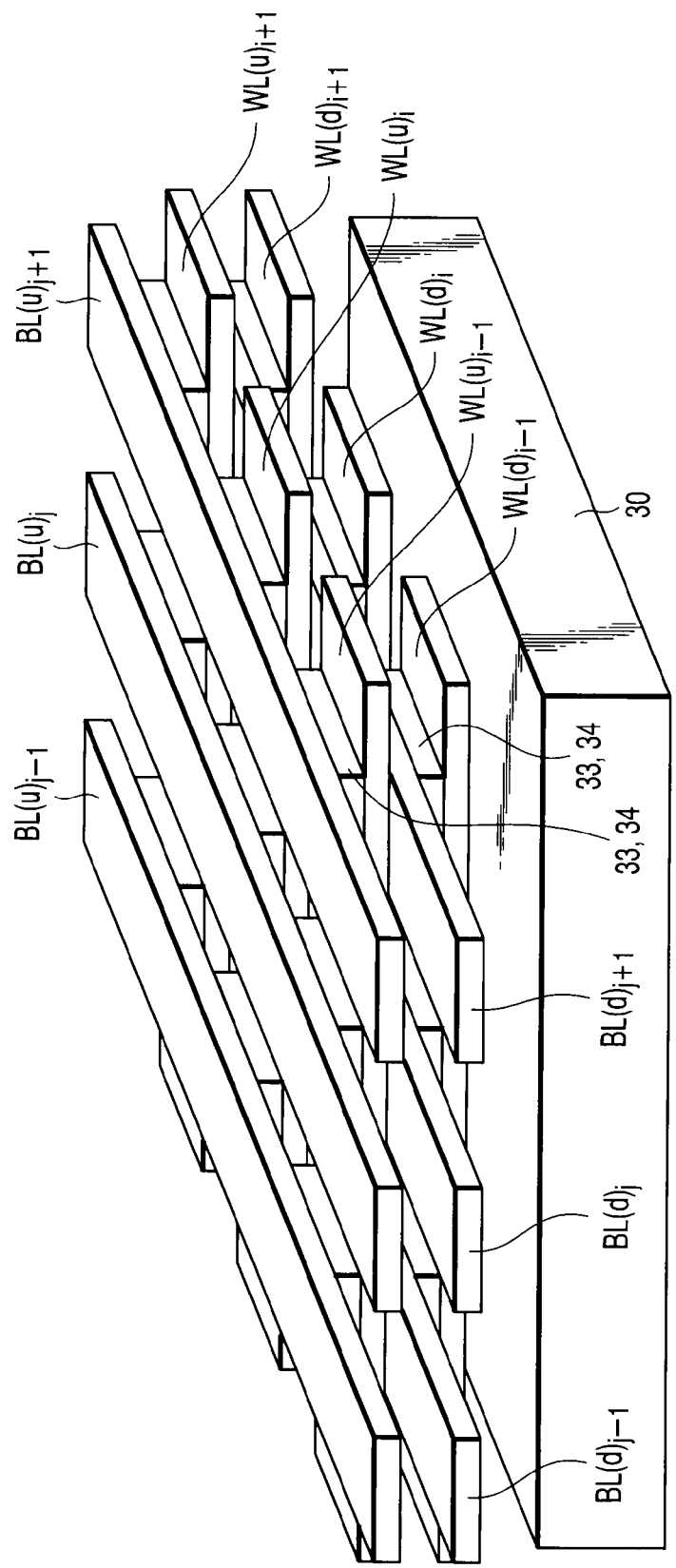

The feature of this cross-point cell array structure is that the structure is advantageous in high integration because it is unnecessary to individually connect any MOS transistors to the memory cells 33. For example, as shown in FIGS. 11 and 12, it is also possible to give the memory cell array a three-dimensional structure by stacking the memory cells 33.

Figure 10:
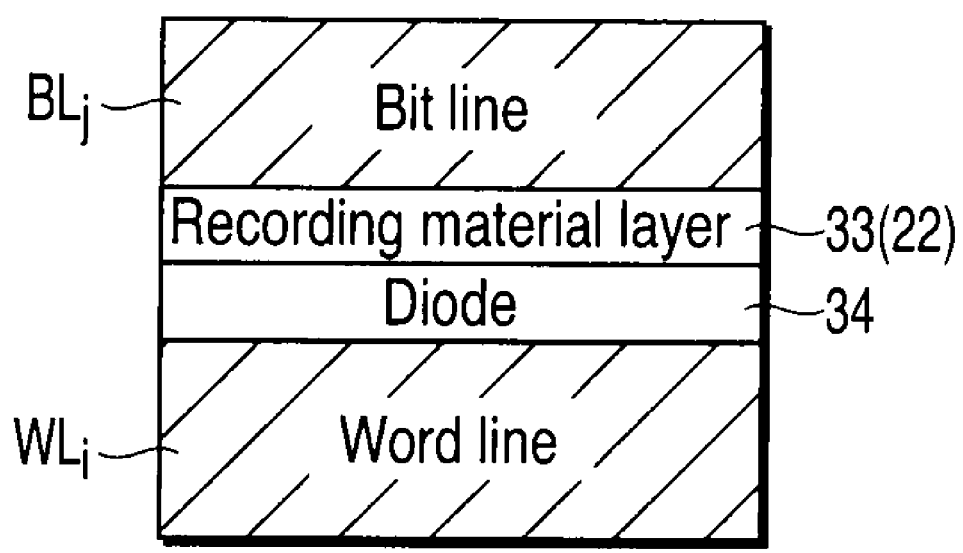
FIG. 10 is a diagram showing a memory cell.

As shown in FIG. 10, the memory cell 33 consists of, e.g., the recording material layer 22. One memory cell 33 stores 1-bit data. Also, the diode 34 is placed between the word line WLi and memory cell 33.

Note that the diode 34 is preferably omitted when switching set and reset by only the direction of a voltage.

B. Writing/Erasing/Reading

Writing/erasing/reading will be explained below with reference to FIGS. 8 to 10.

Assume that the memory cell 33 enclosed within a dotted line A is selected, and writing/erasing/reading are performed on the memory cell 33.

In the write operation (set operation), it is only necessary to produce a potential gradient in the selected memory cell 33 by applying a voltage to it, and supply a current pulse. Therefore, for example, the potential of the word line WLi is made relatively higher than that of the bit line BLj. A positive potential need only be given to the word line WLi, when the bit line BLj has a fixed potential (e.g., ground potential).

In this state, in the selected memory cell 33 enclosed within the dotted line A, for example, some cations (diffusible ions) in the first compound 12A shown in FIG. 5 move into an air gap area of the second compound 12B. Accordingly, the valence of the cations (transition element ions) in the first compound 12A increases, and that of the cations (transition element ions) in the second compound 12B decreases.

As a consequence, the memory cell 33 changes from the high-resistance state to the low-resistance state, and the set operation (writing) is completed.

Note that in the write operation, it is favorable to bias all the unselected word lines WLi−1 and WLi+1 and unselected bit lines BLj−1 and BLj+1 to the same potential.

Note also that in a standby state before the write operation, it is favorable to precharge all the word lines WLi−1, WLi, and WLi+1 and all the bit lines BLj−1, BLj, and BLj+1.

The erase operation (reset operation) uses Joule heat produced by supplying a large-current pulse to the selected memory cell 33 and the residual heat of the Joule heat. Therefore, for example, the potential of the word line WLi is made relatively higher than that of the bit line BLj. A positive potential need only be given to the word line WLi, when the bit line BLj has a fixed potential (e.g., ground potential).

In this state, in the selected memory cell 33 enclosed within the dotted line A, for example, some cations (diffusible ions) in the second compound 12B shown in FIG. 7 move into an air gap area of the first compound 12A. Accordingly, the valence of the cations (transition element ions) in the second compound 12B increases, and that of the cations (transition element ions) in the first compound 12A decreases.

As a consequence, the memory cell 33 changes from the low-resistance state to the high-resistance state, and the reset operation (erasing) is completed.

The erase operation can also be performed by the following method. In this case, however, the diode 34 is preferably removed from the semiconductor memory shown in FIGS. 8 and 9 as described previously.

For example, the potential of the word line WLi is made relatively lower than that of the bit line BLj. A negative potential need only be given to the word line WLi, when the bit line BLj has a fixed potential (e.g., ground potential).

In this state, in the selected memory cell 33 enclosed within the dotted line A, for example, some cations (diffusible ions) in the second compound 12B shown in FIG. 7 move into an air gap area of the first compound 12A. Therefore, the valence of the cations (transition element ions) in the second compound 12B increases, and that of the cations (transition element ions) in the first compound 12A decreases.

Consequently, the memory cell 33 changes from the low-resistance state to the high-resistance state, and the reset operation (erasing) is completed.

Note that it is favorable to bias all the unselected word lines WLi−1 and WLi+1 and unselected bit lines BLj−1 and BLj+1 to the same potential in the erase operation as well.

Note also that in a standby state before the erase operation, it is favorable to precharge all the word lines WLi−1, WLi, and WLi+1 and all the bit lines BLj−1, BLj, and BLj+1.

The read operation is performed by supplying a current pulse to the selected memory cell 33 enclosed within the dotted line A, and detecting the resistance of the memory cell 33. A current pulse must have a very small by which the recording material forming the memory cell 33 does not change the resistance.

For example, a read current (current pulse) produced by a read circuit is supplied from the bit line BLj to the memory cell 33 enclosed within the dotted line A, and the read circuit measures the resistance of the memory cell 33.

When using the recording layer having the double-layered structure as shown in FIGS. 5 and 7, it is possible to ensure a resistance difference of $10^3$ or more between the set and reset states.

C. Summary

The semiconductor memory as described above can achieve a higher recording density and lower power consumption than those of the existing hard disks and flash memories with high reliability.

(3) Others

This embodiment has been explained for the two memories, i.e., the probe memory and semiconductor memory. However, the materials and principles proposed in the examples of the present invention are also applicable to recording media such as the existing hard disk and DVD.

4. Examples of Experiments

Experimental examples in which several samples are formed and the resistance difference between the reset (erasing) state and set (writing) state is evaluated will be explained below.

The recording medium having the structure shown in FIGS. 5 and 7 is used as the samples.

The evaluation is performed using a pair of probes sharpened such that the diameter of the tip is 10 nm or less.

The pair of probes is brought into contact with the electrode layer 13, and writing and erasing are executed using one of the probes. Writing is performed by applying, e.g., a 10-ns-wide, 1-V voltage pulse to the recording material layer 22. Erasing is performed by applying, e.g., a 100-ns-wide, 0.2-V voltage pulse to the recording material layer 22.

Also, reading is executed between writing and erasing by using the other one of the probes. Reading is performed by applying a 10-ns-wide, 0.1-V voltage pulse to the recording material layer 22, and measuring the resistance of the recording material layer (recording bit) 22.

(1) First Experimental Example

The specifications of samples of the first experimental example are as follows.

The recording material layer 22 is formed by a structure in which boron-doped silicon (B-doped Si) with 5 nm is stacked as a lower electrode layer on TiN with 10 nm, $Mn_3O_4$ with 10 nm is directly stacked as a recording layer on the lower electrode layer, and B-doped Si with 5 nm is directly stacked as an upper electrode layer on the recording layer.

After that, 750° C. 10-second annealing is performed, and the SW cycle characteristics of ten samples are checked.

The SW cycle characteristic means the upper limit of the number of times of switching (set/reset) by which the characteristics of the recording layer can be assured.

These samples can achieve a cycle life of 100 cycles or more.

(2) Second Experimental Example

The specifications of samples of the second experimental example are as follows.

The recording material layer 22 is formed by a structure in which boron-doped SiC (B-doped SiC) with 5 nm is stacked on TiN with 10 nm, $Mn_3O_4$ with 10 nm is directly stacked on B-doped SiC, and B-doped SiC is directly stacked on $Mn_3O_4$.

After that, 750° C. 10-second annealing is performed, and the SW cycle characteristics of ten samples are checked.

These samples can achieve a cycle life of 100 cycles or more.

(3) Third Experimental Example

The specifications of samples of the third experimental example are as follows.

The recording material layer 22 is formed by a structure in which aluminum-doped Ge (Al-doped Ge) with 5 nm is stacked on TiN with 10 nm, $Mn_3O_4$ with 10 nm is directly stacked on Al-doped Ge, and Al-doped Ge is directly stacked on $Mn_3O_4$.

After that, 750° C. 10-second annealing is performed, and the SW cycle characteristics of ten samples are checked.

These samples can achieve a cycle life of 100 cycles or more.

(4) Fourth Experimental Example

The specifications of samples of the fourth experimental example are as follows.

The recording material layer 22 is formed a structure in which boron-doped diamond-like carbon (B-doped DLC) with 5 nm is stacked on TiN with 10 nm, $Mn_3O_4$ with 10 nm is directly stacked on B-doped DLC, and B-doped DLC is directly stacked on $Mn_3O_4$.

After that, 750° C. 10-second annealing is performed, and the SW cycle characteristics of ten samples are checked.

These samples can achieve a cycle life of 100 cycles or more.

(5) Fifth Experimental Example

The specifications of samples of the fifth experimental example are as follows.

The recording material layer 22 is formed by a structure in which aluminum-doped GaAs (Al-doped GaAs) with 5 nm is stacked on TiN with 10 nm, $HfO_2$ with 10 nm is directly stacked on Al-doped GaAs, and Al-doped GaAs is directly stacked on $HfO_2$.

After that, 750° C. 10-second annealing is performed, and the SW cycle characteristics of ten samples are checked.

These samples can achieve a cycle life of 100 cycles or more.

(6) Sixth Experimental Example

The specifications of samples of the sixth experimental example are as follows.

The recording material layer 22 is formed by a structure in which indium-doped GaAs (In-doped GaAs) with 5 nm is stacked on TiN with 10 nm, $HfO_2$ with 10 nm is directly stacked on In-doped GaAs, and In-doped GaAs is directly stacked on $HfO_2$.

After that, 750° C. 10-second annealing is performed, and the SW cycle characteristics of ten samples are checked.

These samples can achieve a cycle life of 100 cycles or more.

(7) Seventh Experimental Example

The specifications of samples of the seventh experimental example are as follows.

The recording material layer 22 is formed by a structure in which boron-doped GaN (B-doped GaN) with 5 nm is stacked on TiN with 10 nm, $HfO_2$ with 10 nm is directly stacked on B-doped GaN, and B-doped GaN is directly stacked on $HfO_2$.

After that, 750° C. 10-second annealing is performed, and the SW cycle characteristics of ten samples are checked.

These samples can achieve a cycle life of 100 cycles or more.

(8) Comparative Example

The specifications of samples of a comparative example are as follows.

The recording material layer 22 is formed by a structure in which $Mn_3O_4$ with 10 nm and Pt with 5 nm are stacked on TiN with 10 nm.

After that, 750° C. 10-second annealing is performed, and the SW cycle characteristics of ten samples are checked.

The cycle live of this sample is less than ten cycles.

(9) Conclusion

As explained above, in each of the first to seventh experimental examples, ten samples satisfy the cycle life of 100 cycles or more.

In contrast, in the comparative example, the cycle lives of all the samples are less than ten cycles. This means that the examples to which the present invention is applied are superior to the comparative example in characteristics after annealing, i.e., thermal resistance.

Note that in order to maximize the effects of the experimental examples, the upper and lower electrode layers are desirably in direct contact with the recording layer. However, the effects of the experimental examples can be obtained even when a thin unwanted layer such as a native oxide film exists between the upper or lower electrode layer and the recording layer.

Furthermore, when each electrode layer used in the experimental examples is formed by a polycrystalline layer, it is readily possible to form the memory cell stacked structure and three-dimensional memory cell array structure as described above.

5. Application to Flash Memory

An example of the present invention can also be applied to a flash memory.

Figure 13:
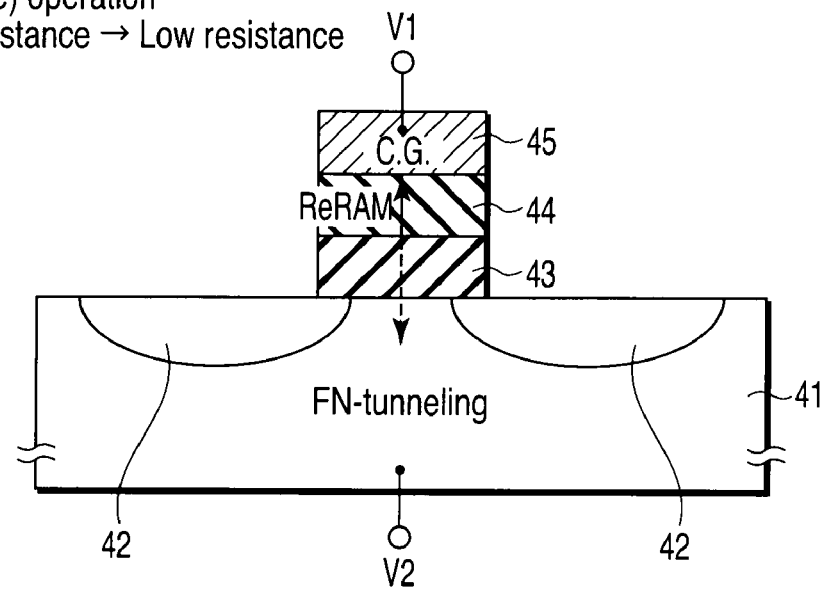
FIG. 13 is a diagram showing a flash memory.
Figure 13:
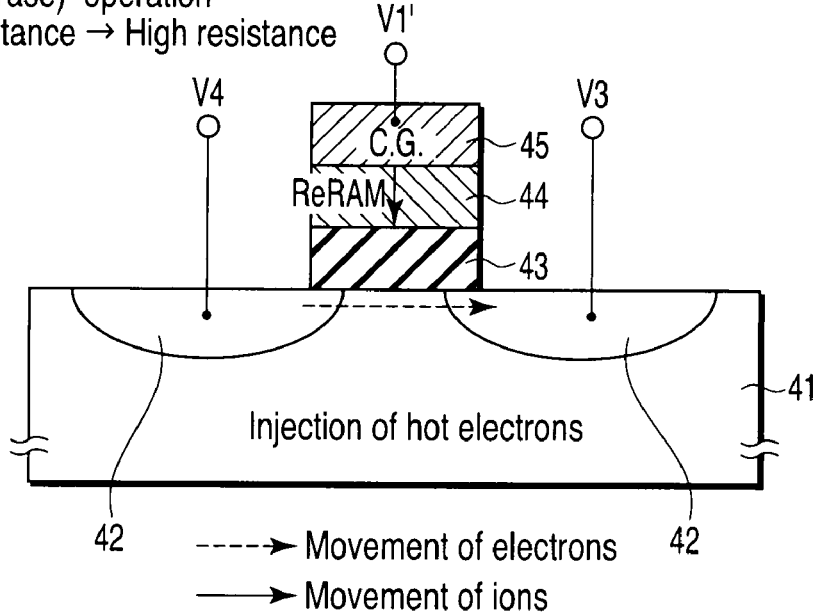

FIG. 13 shows a memory cell of a flash memory.

The memory cell of the flash memory is a metal-insulator-semiconductor (MIS) transistor.

Diffusion layers 42 are formed in the surface region of a semiconductor substrate 41. A gate insulating layer 43 is formed on a channel region between the diffusion layers 42. A recording material layer (resistive RAM [ReRAM]) 44 according to the example of the present invention is formed on the gate insulating layer 43. A control gate electrode 45 is formed on the recording material layer 44.

The semiconductor substrate 41 may also be a well region, and the semiconductor substrate 41 and diffusion layers 42 have opposite conductivity types. The control gate electrode 45 functions as a word line, and consists of, e.g., conductive polysilicon.

The recording material layer 44 is equivalent to the recording layer 12 and electrode layers 11 and 13 shown in FIG. 1, or the recording material layer 22 shown in FIGS. 5 and 7.

A basic operation will be explained below with reference to FIG. 13.

A set (writing) operation is executed by giving a potential V1 to the control gate electrode 45, and a potential V2 to the semiconductor substrate 41.

The difference between potentials V1 and V2 must be large enough to cause the recording layer 44 to change its phase or resistance, but the direction is not particularly limited.

That is, either V1>V2 or V1<V2 is possible.

Assuming that the recording layer 44 is an insulator (high resistance) in the initial state (reset state), the threshold value of the memory cell (MIS transistor) increases because the thickness of the gate insulating layer 43 practically increases.

When the recording layer 44 is changed to a conductor (low resistance) by giving potentials V1 and V2 from this state, the threshold value of the memory cell (MIS transistor) decreases because the thickness of the gate insulating layer 43 practically decreases.

Note that potential V2 is given to the semiconductor substrate 41, but potential V2 may also be transferred from the diffusion layers 42 to the channel region of the memory cell.

A reset (erasing) operation is executed by giving a potential V1' to the control gate electrode 45, a potential V3 to one of the diffusion layers 42, and a potential V4 (<V3) to the other one of the diffusion layers 42.

Potential V1' is set at a value exceeding the threshold value of the memory cell in the set state.

In this state, the memory cell is turned on, electrons flow from the other one of the diffusion layers 42 to one of them, and hot electrons are produced. Since the hot electrons are injected into the recording layer 44 via the gate insulating layer 43, the temperature of the recording layer 44 rises.

Consequently, the recording layer 44 changes from the conductor (low resistance) to the insulator (high resistance). Since the thickness of the gate insulating layer 43 practically increases, the threshold value of the memory cell (MIS transistor) increases.

As described above, the threshold value of the memory cell can be changed by the principle similar to that of a flash memory. This makes it possible to put the data recording/reproducing device according to the example of the present invention to practical use by using the technique of a flash memory.

6. Material Examples

In the examples of the present invention, the electrode layers in contact with the upper and lower surfaces of the recording layer consist of the p- or n-type-carrier-doped IV or III-V semiconductor.

Examples of the semiconductor are Si, SiC, SiGe, Ge, GaN, DLC, and diamond. The resistivity of the semiconductor is desirably smaller than the minimum resistivity of the recording layer, and the carrier density of the semiconductor is desirably $1\times10^{18}$ atoms/cc or more.

The recording layer preferably contains one of (i) $CoO_x$, $FeO_x$, $MnO_x$, $NiO_x$, $CuO_x$, $TiO_x$, $ZrO_x$, $HfO_x$, $NbO_x$, $TaO_x$, $MoO_x$, or $WO_x$ (where $1 \leq x \leq 3$), and (ii) $AB_xO_y$ (where A is one of Mg, Ca, Sr, Al, Ga, Sb, Ti, V, Cr, Mn, Fe, Co, Rh, In, Tl, Pb, and Si, B is one of Al, Ga, Ti, Ge, Sn, V, Nb, Ta, Cr, Mn, Mo, W, Ir, and Os, $0.5 \leq x \leq 2.2$, and $2 \leq y \leq 5$).

7. Conclusion

The data recording/reproducing device according to the example of the present invention can increase the thermal resistance while maintaining the ReRAM operation characteristics.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An information recording/reproducing device comprising:
   a recording layer as a variable resistance including oxide; and
   a first electrode layer covering a first surface of the recording layer;
   a second electrode layer covering a second surface of the recording layer;
   a circuit which supplies voltages to the recording layer to change a resistance of the recording layer,
   wherein each of the first and second electrode layers comprises IV or III-V semiconductor doped with p-type carrier or n-type carrier, and a resistance of the semiconductor is smaller than the minimum resistance of the recording layer.

2. The device according to claim 1,
   wherein the semiconductor is one of the materials selected from Si, SiC, SiGe, Ge, GaN, DLC and diamond.

3. The device according to claim 1,
   wherein the recording layer includes at least one material selected from
   i). CoOx, FeOx, MnOx, NiOx, CuOx, TiOx, ZrOx, HfOx, NbOx, TaOx, MoOx, WOx
   where $1 \leq x \leq 3$
   ii). $AB_xO_y$,
   where A is one of Mg, Ca, Sr, Al, Ga, Sb, Ti, V, Cr, Mn, Fe, Co, Rh, In, Ti, Pb Si, B is one of Al, Ga, Ti, Ge, Sn, V, Nb, Ta, Cr, Mn, Mo, W, Ir, Os, and $0.5 \leq x \leq 2.2$, $2 \leq y \leq 5$.

4. The device according to claim 1,
   wherein a carrier density of the semiconductor is $1\times10^{18}$ atoms/cc or more.

5. The device according to claim 1,
   wherein the resistance of the recording layer is changed by the voltages being applied in the same direction each other.

6. The device according to claim 1,
   wherein the resistance of the recording layer is changed by the voltages being applied in the opposite direction each other.

7. The device according to claim 1,
wherein the first and second electrode layers are made of the same material.

8. The device according to claim 1,
wherein the first and second electrode layers are made of the different material.

9. The device according to claim 1,
wherein the recording layer includes a diffusible ion, a transition element ion and an anion.

10. The device according to claim 1,
wherein the device is a probe memory, and the circuit includes a probe which supplies the voltages to the recording layer.

11. The device according to claim 10,
further comprising a protection layer which is provided on the second electrode layer, wherein the probe contacts to the protection layer.

12. The device according to claim 10,
wherein the recording layer includes a data area and a servo area.

13. The device according to claim 1,
wherein the device is a semiconductor memory, and the circuit includes a word line and a bit line which supply the voltages to the recording layer.

14. The device according to claim 13,
further comprising a diode which is connected to the recording layer, wherein the diode and the recording layer is provided between the word line and the bit line.

15. The device according to claim 13,
wherein the first electrode, the second electrode and the recording layer function as a memory cell.

16. The device according to claim 1,
wherein the device is a memory cell of a flash memory, and the circuit includes a control gate electrode which supply the voltages to the recording layer.

17. The device according to claim 16,
further comprising a semiconductor substrate, diffusion layers in the semiconductor substrate, and a gate insulating layer on the semiconductor substrate between the diffusion layers, wherein the recording layer is provided between the gate insulating layer and the control gate electrode.

18. The device according to claim 17,
wherein the resistance of the recording layer is changed by a movement of electrons from the recording layer to the semiconductor substrate.

19. The device according to claim 17,
wherein the resistance of the recording layer is changed by a injection of hot electrons from the semiconductor substrate to the recording layer.

* * * * *